United States Patent
Suh et al.

(10) Patent No.: US 7,728,356 B2
(45) Date of Patent: Jun. 1, 2010

(54) P-GAN/ALGAN/ALN/GAN ENHANCEMENT-MODE FIELD EFFECT TRANSISTOR

(75) Inventors: Chang Soo Suh, Santa Barbara, CA (US); Umesh K. Mishra, Montecito, CA (US)

(73) Assignee: The Regents of the University of California, Oakland, CA (US)

( * ) Notice: Subject to any disclaimer, the term of this patent is extended or adjusted under 35 U.S.C. 154(b) by 74 days.

(21) Appl. No.: 12/131,704

(22) Filed: Jun. 2, 2008

(65) Prior Publication Data

US 2008/0296618 A1 Dec. 4, 2008

Related U.S. Application Data

(60) Provisional application No. 60/941,580, filed on Jun. 1, 2007.

(51) Int. Cl.
*H01L 29/778* (2006.01)
(52) U.S. Cl. .............. 257/194; 257/183; 257/190; 257/E29.246; 257/E21.403
(58) Field of Classification Search ............. 257/183, 257/190, 194, E29.246, E21.403
See application file for complete search history.

(56) References Cited

U.S. PATENT DOCUMENTS

| 2005/0077541 A1 | 4/2005 | Shen et al. |
| 2006/0197109 A1 | 9/2006 | Saxler |
| 2006/0214188 A1 | 9/2006 | Kawasaki et al. |

OTHER PUBLICATIONS

PCT International Search Report, International Application No. PCT/US2008/065543, Filing Date Jun. 2, 2008.
Lanford et al., Electronics Letters, vol. 41, p. 449 (2005).
Cai et al., IEEE Electron Device Letters, vol. 26, p. 435 (2005).
Hu et al., "Enhancement Mode AlGaN/GaN HFET with selectively grown pn junction gate," Electronics Letters, vol. 36, p. 753 (2000).
Tsuyukuchi et al., "Low leakage current Enhancement Mode AlGaN/GaN Heterostructure Field Effect Transistor using p-type gate contact," Japanese Journal of Applied Physics 45(11), L319-L321 (2006).

*Primary Examiner*—Tan N Tran
(74) *Attorney, Agent, or Firm*—Gates & Cooper LLP

(57) ABSTRACT

An enhancement mode High Electron Mobility Transistor (HEMT) comprising a p-type nitride layer between the gate and a channel of the HEMT, for reducing an electron population under the gate. The HEMT may also comprise an Aluminum Nitride (AlN) layer between an AlGaN layer and buffer layer of the HEMT to reduce an on resistance of a channel.

10 Claims, 19 Drawing Sheets

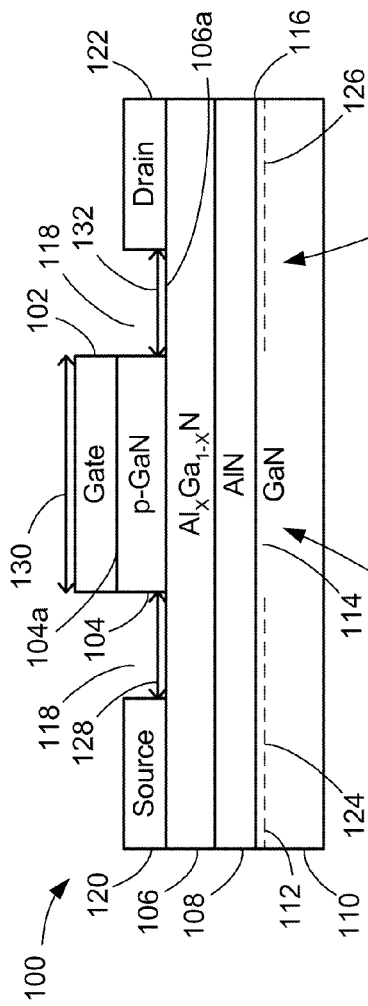
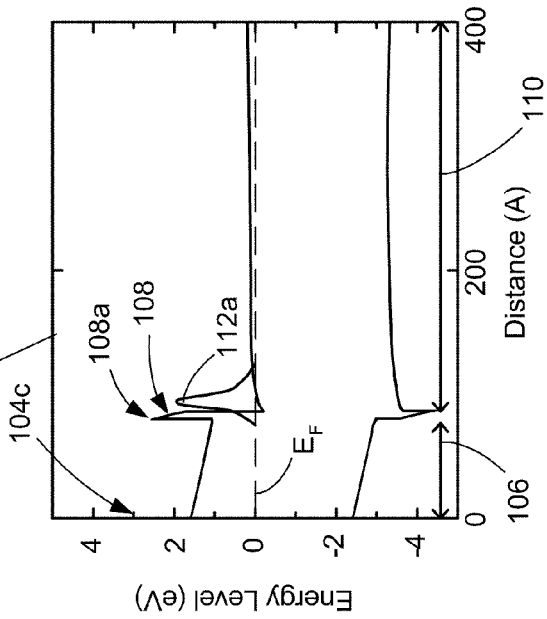
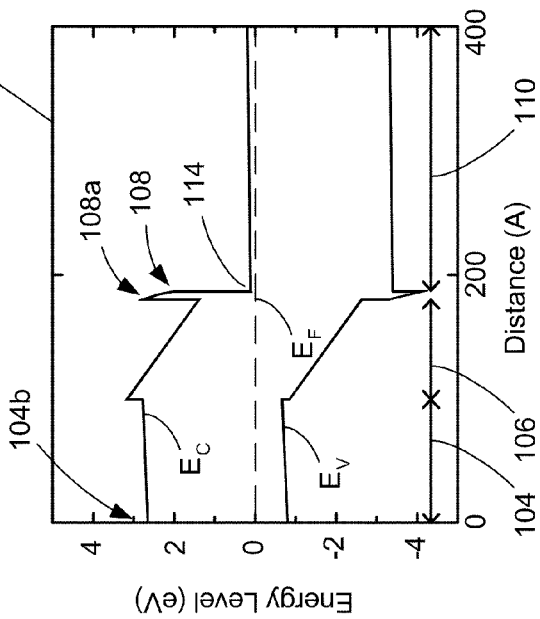
*Fig. 1(a)*
*Fig. 1(b)*
*Fig. 1(c)*

P-GAN/ALGAN/ALN/GAN ENHANCEMENT-MODE FIELD EFFECT TRANSISTOR

CROSS-REFERENCE TO RELATED APPLICATIONS

This application claims the benefit under 35 U.S.C. Section 119(e) of commonly-assigned U.S. Provisional Patent Application Ser. No. 60/941,580 filed on Jun. 1, 2007, by Chang Soo Suh and Umesh K. Mishra, entitled "P-GaN/AlGaN/AlN/GaN ENHANCEMENT-MODE FIELD EFFECT TRANSISTOR", which application is incorporated by reference herein.

This application is related to the following co-pending and commonly-assigned applications:

U.S. Utility patent application Ser. No. 10/962,911, filed on Oct. 12, 2004, by Likun Shen, Sten J. Heikman and Umesh K. Mishra, entitled "GaN/AlGaN/GaN DISPERSION-FREE HIGH ELECTRON MOBILITY TRANSISTORS,", which application claims the benefit under 35 U.S.C Section 119(e) of U.S. Provisional Application Ser. No. 60/510,695, filed on Oct. 10, 2003, by Likun Shen, Sten J. Heikman and Umesh K. Mishra, entitled "GaN/AlGaN/GaN DISPERSION-FREE HIGH ELECTRON MOBILITY TRANSISTORS,";

U.S. patent application Ser. No. 11/523,286, filed on Sep. 18, 2006, by Siddharth Rajan, Chang Soo Suh, James S. Speck, and Umesh K. Mishra, entitled "N-POLAR ALUMINUM GALLIUM NITRIDE/GALLIUM NITRIDE ENHANCEMENT-MODE FIELD EFFECT TRANSISTOR,", which claims priority to U.S. Provisional Patent Application Ser. No. 60/717,996, filed on Sep. 16, 2005, by Siddharth Rajan, Chang Soo Suh, James S. Speck, and Umesh K. Mishra, entitled "N-POLAR ALUMINUM GALLIUM NITRIDE/GALLIUM NITRIDE ENHANCEMENT-MODE FIELD EFFECT TRANSISTOR,";

U.S. patent application Ser. No. 11/599,874 filed on Nov. 15, 2006, by Tomas Palacios, Likun Shen and Umesh K. Mishra, entitled "FLUORINE TREATMENT TO SHAPE THE ELECTRIC FIELD IN ELECTRON DEVICES, PASSIVATE DISLOCATIONS AND POINT DEFECTS, AND ENHANCE THE LUMINESCENCE EFFICIENCY OF OPTICAL DEVICES,", which application claims the benefit under 35 U.S.C Section 119(e) of U.S. Provisional Application Ser. No. 60/736,628, filed on Nov. 15, 2005, by Tomas Palacios, Likun Shen and Umesh K. Mishra, entitled "FLUORINE TREATMENT TO SHAPE THE ELECTRIC FIELD IN ELECTRON DEVICES, PASSIVATE DISLOCATIONS AND POINT DEFECTS, AND ENHANCE THE LUMINESCENCE EFFICIENCY OF OPTICAL DEVICES,";

U.S. Utility patent application Ser. No. 11/768,105, filed Jun. 25, 2007, by Michael Grundmann and Umesh K. Mishra, entitled "POLARIZATION INDUCED TUNNEL JUNCTION", which application claims priority under 35 U.S.C. Section 119(e) of U.S. Provisional Patent Application Ser. No. 60/815,944, filed on Jun. 23, 2006, by Michael Grundmann and Umesh K. Mishra, entitled "POLARIZATION INDUCED TUNNEL JUNCTION";

U.S. Utility patent application Ser. No. 12/059,902 filed on Mar. 31, 2008, by Umesh K. Mishra, Yi Pei, Siddharth Rajan, and Man Hoi Wong, entitled "N-FACE HIGH ELECTRON MOBILITY TRANSISTORS WITH LOW BUFFER LEAKAGE AND LOW PARASITIC RESISTANCE", which application claims priority under 35 U.S.C. Section 119(e) of U.S. Provisional Patent Application Ser. No. 60/908,914 filed on Mar. 29, 2007, by Umesh K. Mishra, Yi Pei, Siddharth Rajan, and Man Hoi Wong, entitled "N-FACE HIGH ELECTRON MOBILITY TRANSISTORS WITH LOW BUFFER LEAKAGE AND LOW PARASITIC RESISTANCE";

U.S. Utility patent application Ser. No. 12/045,561 filed on Mar. 10, 2008, by Lee S. McCarthy, Umesh K. Mishra, Felix Recht, and Tomas Palacios, entitled "A METHOD TO FABRICATE III-N FIELD EFFECT TRANSISTORS USING ION IMPLANTATION WITH REDUCED DOPANT ACTIVATION AND DAMAGE RECOVERY TEMPERATURE", which application claims priority under 35 U.S.C. Section 119(e) of U.S. Provisional Patent Application Ser. No. 60/894,124 filed on Mar. 9, 2007, by Lee S. McCarthy, Umesh K. Mishra, Felix Recht, and Tomas Palacios, entitled "A METHOD TO FABRICATE III-N FIELD EFFECT TRANSISTORS USING ION IMPLANTATION WITH REDUCED DOPANT ACTIVATION AND DAMAGE RECOVERY TEMPERATURE"; and U.S. Utility patent application Ser. No. 12/127,661 filed on May 27, 2008, by Umesh K. Mishra, Tomas Palacios, and Man Hoi Wong, entitled "POLARIZATION-INDUCED BARRIERS FOR N-FACE NITRIDE-BASED ELECTRONICS", which application claims priority under 35 U.S.C. Section 119(e) of U.S. Provisional Patent Application Ser. No. 60/940,052 filed on May 24, 2007, by Umesh K. Mishra, Tomas Palacios, and Man Hoi Wong, entitled "POLARIZATION-INDUCED BARRIERS FOR N-FACE NITRIDE-BASED ELECTRONICS";

all of which applications are incorporated by reference herein.

STATEMENT REGARDING FEDERALLY SPONSORED RESEARCH AND DEVELOPMENT

This invention was made with Government support under Grant No. N00014-01-10764 (ONR). The Government has certain rights in this invention.

BACKGROUND OF THE INVENTION

1. Field of the Invention

The present invention relates to an improved enhancement mode field effect transistor (FET).

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Enhancement mode (E-mode), or normally-off devices, based on Gallium Nitride (GaN) technology are interesting for a variety of applications, for example, in integration of control circuitry and for the added safety of a normally-off device in power switching applications. Enhancement mode operation is commonly achieved using an AlGaN/GaN buffer structure, by etching away some of the AlGaN under the gate region until all the charge is depleted [1], or by exposing the AlGaN under the gate with fluoride-based plasma until negatively charged fixed fluorine ions screen all the charge in the channel [2]. These devices suffer from threshold voltage non-uniformity and repeatability, due to the processes requiring gate recess etch or plasma treatment. Also, these devices have a low Schottky gate turn-on voltage (of at most 2 V) due to low Schottky barriers. If a threshold voltage of 1 V is required, these devices are left with a maximum modulation of 1 V. Because high-power switching applications require a threshold voltage of over 1 V for gate signal noise immunity, increasing the gate turn-on voltage is crucial.

Utilization of p-GaN barrier below the gate [3,4] depletes the channel and increases the gate turn-on voltage to 3 V, rendering it attractive for high-power applications. However, such field effect devices suffer from high on-resistance. The present invention seeks to reduce the on-resistance.

SUMMARY OF THE INVENTION

To overcome the limitations in the prior art described above, and to overcome other limitations that will become apparent upon reading and understanding the present specification, the present invention discloses a novel enhancement mode High Electron Mobility Transistor (HEMT) structure with a p-GaN cap layer for high gate turn-on plus an aluminum nitride (AlN) interlayer for low on-resistance.

Under the gate, this transistor has a p-GaN/AlGaN/AlN/GaN epilayer structure. The high barrier of the p-GaN layer depletes the electron gas at the AlN/GaN interface under zero gate bias, and also increases the gate turn-on voltage. Furthermore, changing the aluminum (Al) composition and the thickness of the AlGaN layer controls the threshold voltage over a wide range.

Under the access and contact regions, the epilayer is AlGaN/AlN/GaN. Without the high barrier of p-GaN, polarization fields in the AlGaN and AlN layers allow a charge sheet to form at the AlN/GaN interface, thus leading to low on-resistance. The on-resistance is further reduced due to increased mobility of the 2DEG charge at the AlN/GaN interface compared to the mobility of 2DEGs at AlGaN/GaN interfaces. The AlN layer is required to maintain low on-resistance especially when high threshold voltage is desired. Because threshold voltage can be controlled over a wide range while maintaining low on-resistance, this device can be used as a normally-off, or enhancement mode FET, for different applications. The idea of using high p-GaN barrier to reduce the electron population under the gate, plus the idea of using AlN interlayer to reduce on resistance is the basic principle behind this device.

The present invention discloses a method for fabricating a field effect transistor, comprising using a III-nitride barrier layer to control a threshold voltage of a gate of the transistor and confine a two dimensional electron gas (2DEG) to a channel layer of the transistor; and using a polarization induced electric field of a III-nitride interlayer between the 2DEG and the III-nitride barrier layer to induce a larger 2DEG charge density as compared to without the III-nitride interlayer, thereby reducing an on-resistance of the transistor and controlling the on-resistance independently of the threshold voltage.

The method may further comprise selecting a thickness and material composition of the III-nitride barrier layer to obtain a desired threshold voltage of the transistor, wherein the thickness of the III-nitride barrier layer does not substantially decrease the on-resistance of the transistor.

The III-nitride barrier layer may be AlGaN, and the material composition may be Al content, and the transistor may be an enhancement mode High Electron Mobility Transistor (HEMT).

The thickness and material composition may be selected to obtain a threshold voltage of 1 V or greater. The obtained threshold voltage may be at least 1 V and the on-resistance may correspond to a charge density in the 2DEG in excess of $7 \times 10^{12}$ cm$^{-2}$ or allow a current density in the 2DEG in excess of 0.3 A/mm. The thickness and composition may be selected to maximize the threshold voltage.

The method may further comprise using a thickness of p-III-nitride cap layer between the gate and the III-nitride barrier layer to increase a gate turn-on of the transistor's gate, wherein the p-III-nitride layer depletes the 2DEG under the gate at zero gate bias. The gate turn-on may be at least 3 V.

The method may further comprise removing the p-III-nitride cap layer from in and under contact regions and access regions of the transistor, wherein the thickness of the III-nitride barrier layer is smaller than a thickness of the III-nitride barrier layer in a transistor without the III-nitride barrier layer. The transistor may be an enhancement mode HEMT, wherein the III-nitride barrier layer is AlGaN and the p-III-nitride layer is p-GaN.

The present invention further discloses a nitride based enhancement mode High Electron Mobility Transistor (HEMT), comprising a III-nitride channel layer having a channel potential energy for containing a two dimensional electron gas (2DEG), wherein the 2DEG has a resistance; a III-nitride barrier layer positioned for, and having a barrier potential energy for, confining the 2DEG in the channel layer, wherein a polarization coefficient of the barrier layer is larger than a polarization coefficient of the channel layer; a III-nitride interlayer between the barrier layer and the channel layer, wherein the III-nitride interlayer has a polarization coefficient higher than the polarization coefficient of the barrier layer; a source for supplying a current to the 2DEG; a drain for supplying an output current, wherein the current flows from the source, through the 2DEG and then to the drain to produce the output current; a gate for controlling the current's flow through the 2DEG; and a p-type III-nitride layer between the III-nitride barrier layer and the gate for depleting the 2DEG under the gate at zero bias.

The HEMT may further comprise a thickness and material composition of the III-nitride barrier layer, wherein the thickness and the material composition is selected to obtain a desired threshold voltage of the HEMT. The HEMT may further comprise a thickness of the p-type III-nitride layer, wherein the thickness of the p-type III-nitride layer is selected to obtain a turn-on voltage of the gate of 3 V or greater. The thickness of the III-nitride barrier layer may not substantially reduce an on-resistance of the HEMT or resistance of the 2DEG.

The thickness and the material composition of the III-nitride barrier may be selected to obtain the threshold voltage of at least 1V and a charge density of the 2DEG in excess of $7 \times 10^{12}$ cm$^{-2}$ or a current density in the 2DEG is in excess of 0.3 A/mm.

The HEMT may further comprise a first access region between the source and the gate and a second access region between the drain and the gate, wherein the p-type III-nitride layer is not present under the source, drain, first access region and second access region; and the thickness of the III-nitride barrier layer which is smaller than a thickness of the III-nitride barrier layer in a HEMT without the III-nitride interlayer.

The III-nitride barrier layer may be AlGaN, the material composition may be an Al content, and the III-nitride interlayer may be AlN. A thickness of the AlN may be thin enough such that the AlN is not relaxed but is strained, due to a lattice mismatch with the barrier layer and the channel layer, or the thickness of the AlN may be less than 20 nm. The III-nitride interlayer may interface the III-nitride barrier layer and the III-nitride channel layer. The channel layer may be GaN and the p-type III-nitride layer may be p-GaN.

BRIEF DESCRIPTION OF THE DRAWINGS

Referring now to the drawings in which like reference numbers represent corresponding parts throughout:

FIG. 1(a) shows a schematic of an enhancement mode device, and band diagrams of the enhancement mode device under the gate (FIG. 1(b)) and under the access region and contact region (FIG. 1(c)), wherein the two dimensional electron gas (2DEG) is depleted beneath the gate at zero bias.

DETAILED DESCRIPTION OF THE INVENTION

Figures 2A, 2B:
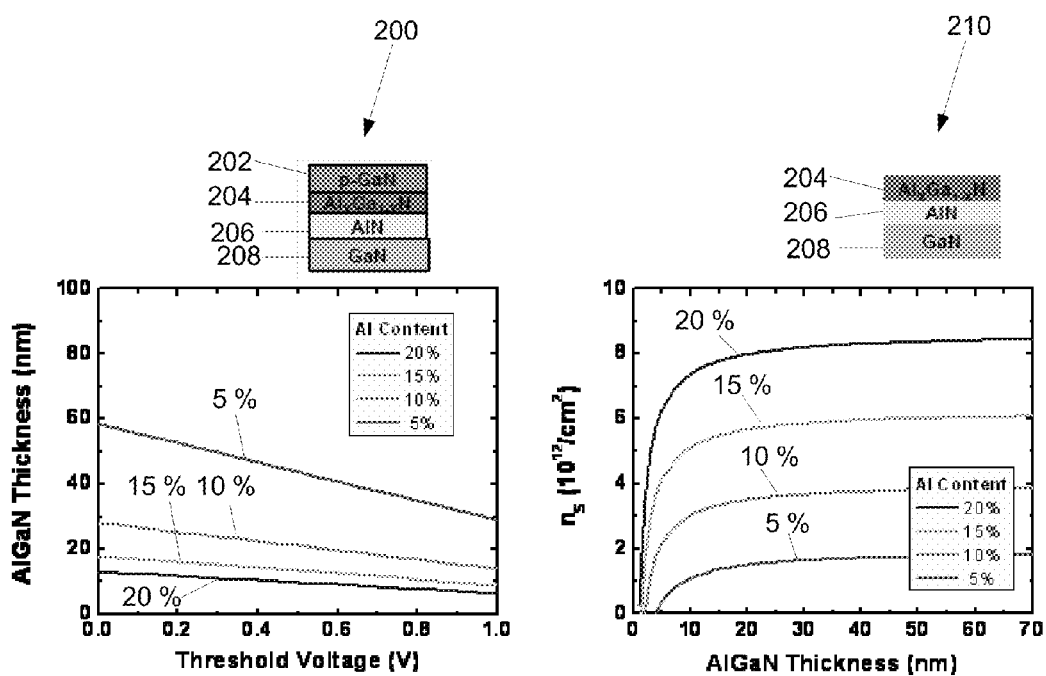
FIG. 2(a) shows a graph (calculation) of AlGaN thickness vs. threshold voltage.
FIG. 2(b) shows a graph (calculation) of sheet charge vs. AlGaN thickness, for a p-GaN/AlGaN/AlN/GaN structure, wherein sheet charge density is high (approximately 7 to $8 \times 10^{12}$ cm$^{-2}$) at an AlGaN thickness required for high threshold voltages.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

The present invention comprises a device structure with a p-GaN cap layer and an AlN interlayer which does not have the drawbacks seen in the above mentioned devices. The structure for this device 100 is shown in FIG. 1(a). Under the gate 102, the epilayer stack comprises (from top to bottom) p-GaN 104, $Al_xGa_{1-x}N$ 106 (with 0<x<1), AlN 108 and a GaN-buffer 110. The high barrier of the p-GaN 104 layer fully depletes the electron gas 112 at the portion 114 of the interface 116 (between the AlN 108 and GaN-buffer 110) which is under the gate 102 (under zero gate bias, see FIG. 1(a)), lowers gate leakage, and also increases the gate turn-on voltage (to at least 3V). Furthermore, changing the Al composition and the thickness of the AlGaN 106 layer controls the threshold voltage over a wide range.

FIG. 1(b) is a band diagram (showing conduction band $E_C$, valence band $E_V$ and Fermi level $E_F$) through the layers 104-110 of the enhancement mode device 100 under the gate 102, wherein the two dimensional electron gas (2DEG) 112 is depleted beneath the gate 102 at zero bias, distance=0 corresponds to the surface 104a of the p-GaN layer 104, and the position of the layers 104-110 is indicated. FIG. 1(b) illustrates a method for fabricating an enhancement mode transistor, comprising using one or more first barrier layers 104 between a second barrier layer 106 and a gate 102 (positioned on the surface at distance=0) to raise a potential energy $E_C$ (or create a high barrier 104b) in a region between the channel 110 and the gate such that a potential energy $E_C$ of the channel 110 (or channel potential energy) is larger than a Fermi level $E_F$ of the transistor at zero gate bias, thereby depleting the 2DEG 112 (or eliminating/depleting charge) from a portion 114 of the channel 110 under the gate 102.

Under the access regions 118 and contact regions 120,122, the epilayer is (from top to bottom) AlGaN 106, AlN 108 and GaN-buffer 110. Etching away the p-GaN 104 in these regions 118, 120, 122 induces a high electron density 112 (up to at least 7 to 8 e12 cm$^{-2}$) at the portions 124, 126 of the interface 116 (between the AlN 108 and the GaN-buffer 110) which are under the access region 118 and contact regions 120,122, due to polarization fields. The 2DEG 112 under the gate 102 (not shown) is induced when the gate 102 is forward biased (not shown), while the charge 112 in the access regions 118 is always present (FIG. 1(b)).

FIG. 1(c) is a graph showing band diagram (showing $E_C$, $E_V$ and Fermi level $E_F$) as a function of distance through the layers 106-110 of the enhancement mode device 100 under the access regions 118 and contact regions 120,122, as well as electron population 112a of the 2DEG 112 as a function of distance, wherein the removal of p-GaN 104c induces the 2DEG 112 charge density 112a, distance=0 corresponds to the surface 106a of the AlGaN layer 106, and the position of the layers 106-110 is indicated. FIG. 1(c) illustrates a method of using a III-nitride interlayer 108 between the 2DEG 112 and the second barrier 106 to reduce an on resistance of the transistor 100. A polarization induced potential barrier 108a (which is the potential energy $E_C$ of the III-nitride interlayer 108) reduces overlap of the electron population 112a (and consequently the 2DEG) with the barrier 106, thereby reducing alloy scattering with the barrier layer 106, and/or increasing mobility of the charge 112 as compared to without the III-nitride layer 108. The polarization induced electric field associated with the polarization induced potential barrier 108a induces a larger electron population 112a than would be possible without the AlN layer 108.

FIG. 1(a) also illustrates the source to gate distance $L_{SG}$ 128, a gate length $L_G$ 130 and a gate to drain distance $L_{GD}$ 132.

FIG. 2(a) shows a graph (calculation) of AlGaN thickness vs. threshold voltage, and FIG. 2(b) shows a graph (calculation) of sheet charge vs. AlGaN thickness, for the device structure of FIG. 1(a), for Al contents of the AlGaN 106 of 5%, 10%, 15% and 20%, wherein sheet charge density is high (approximately 7 to $8 \times 10^{12}$ cm$^{-2}$) at an AlGaN thickness required for high threshold voltages (e.g., an Al content of 20% and an AlGaN thickness of 10 nm. The inset 200 shows the p-GaN 202/AlGaN 204/AlN 206/GaN 208 layer structure used to measure the data of FIG. 2(a), and inset 210 shows the AlGaN 204/AlN 206/GaN 208 layer structure used to measure the data of FIG. 2(b).

FIG. 2(a) shows how changing the Al composition and the thickness of the AlGaN 106 layer controls the threshold voltage over a wide range.

The threshold voltage in these devices 100 is not affected by processing since it is controlled by the epitaxial structure 104-110.

Figure 3:
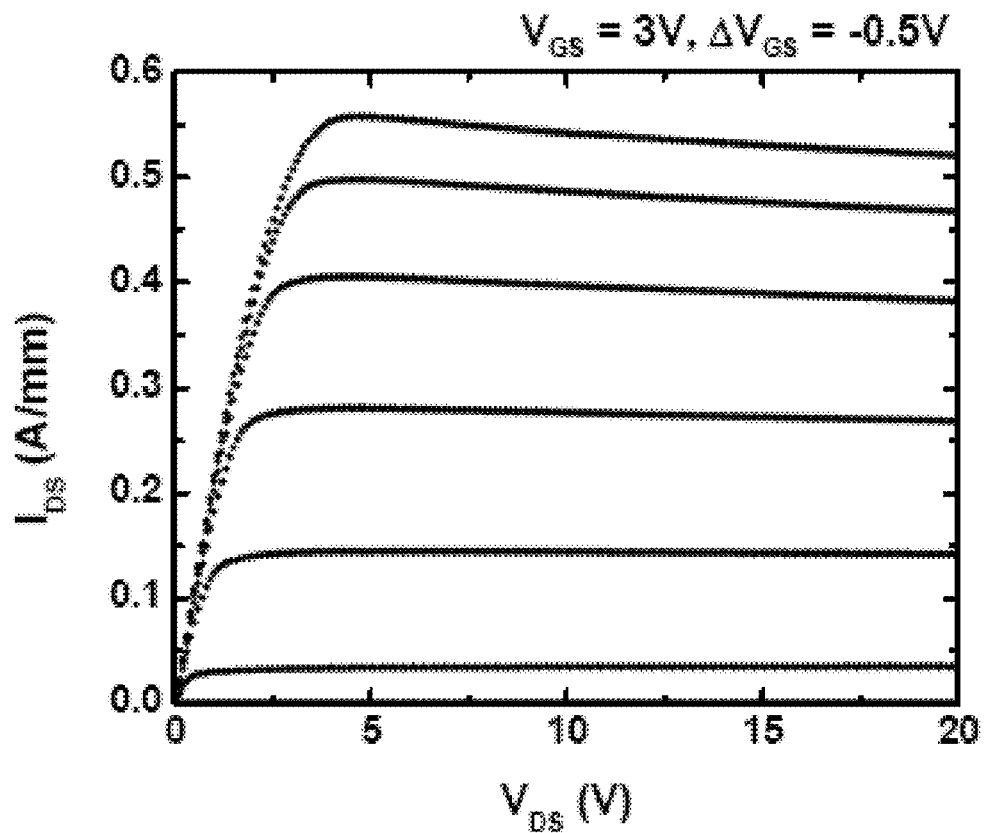
FIG. 3 is a graph plotting the measured drain-source current $I_{DS}$ as a function of drain-source voltage $V_{DS}$, wherein the gate-source voltage $V_{GS}$ is ramped from $V_{GS}$=0.5 V (bottom curve) to $V_{GS}$=3V (top curve) in increments of $\Delta V_{GS}$=0.5 V.
Figure 4:
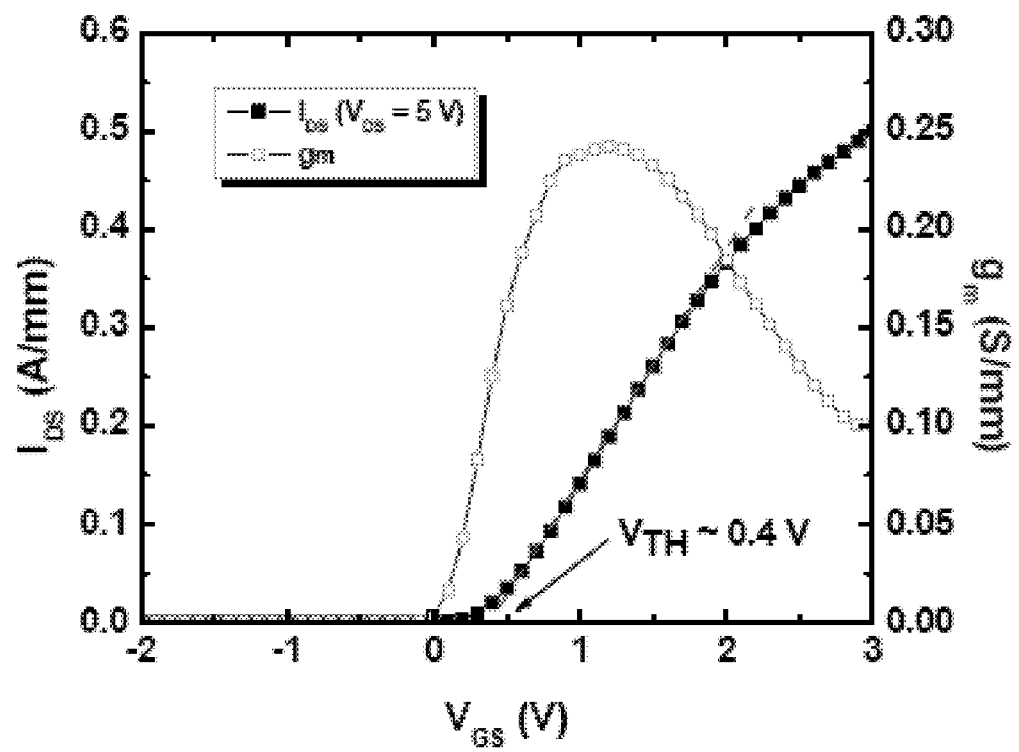
FIG. 4 is a graph plotting the measured $I_{DS}$ as a function of $V_{GS}$ and plotting the measured transconductance ($g_m$) as a function of $V_{DS}$.
Figure 5:
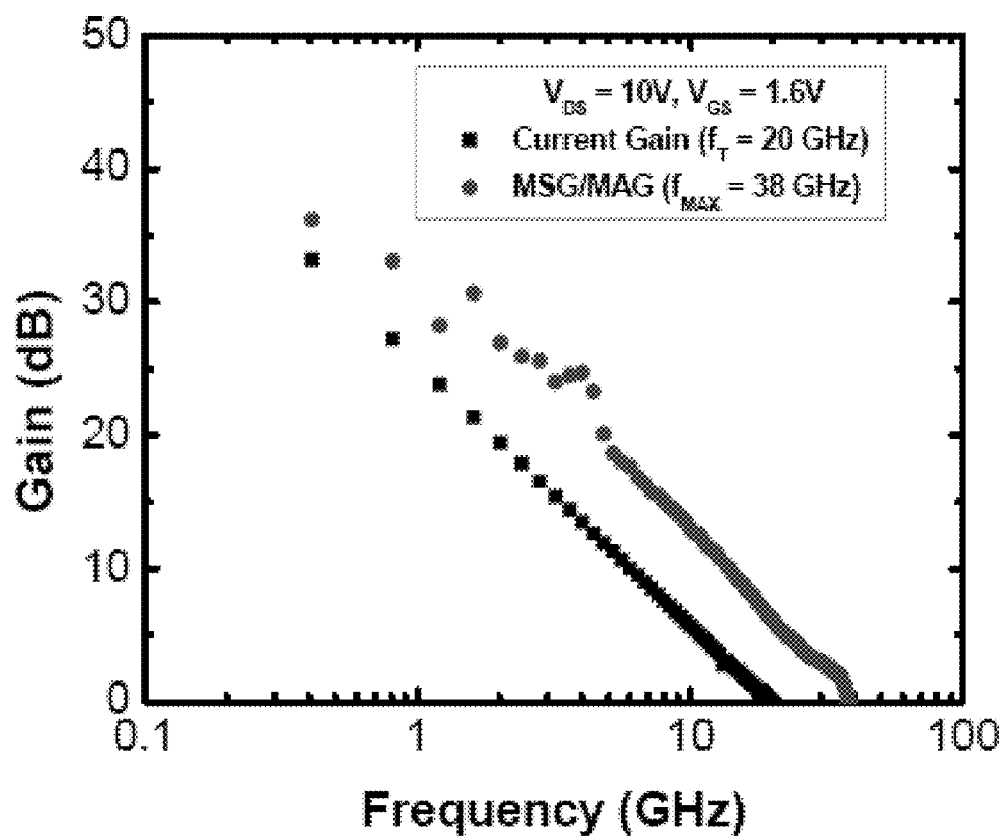
FIG. 5 is a graph plotting gain as a function of frequency of $V_{GS}$.
Figure 6:
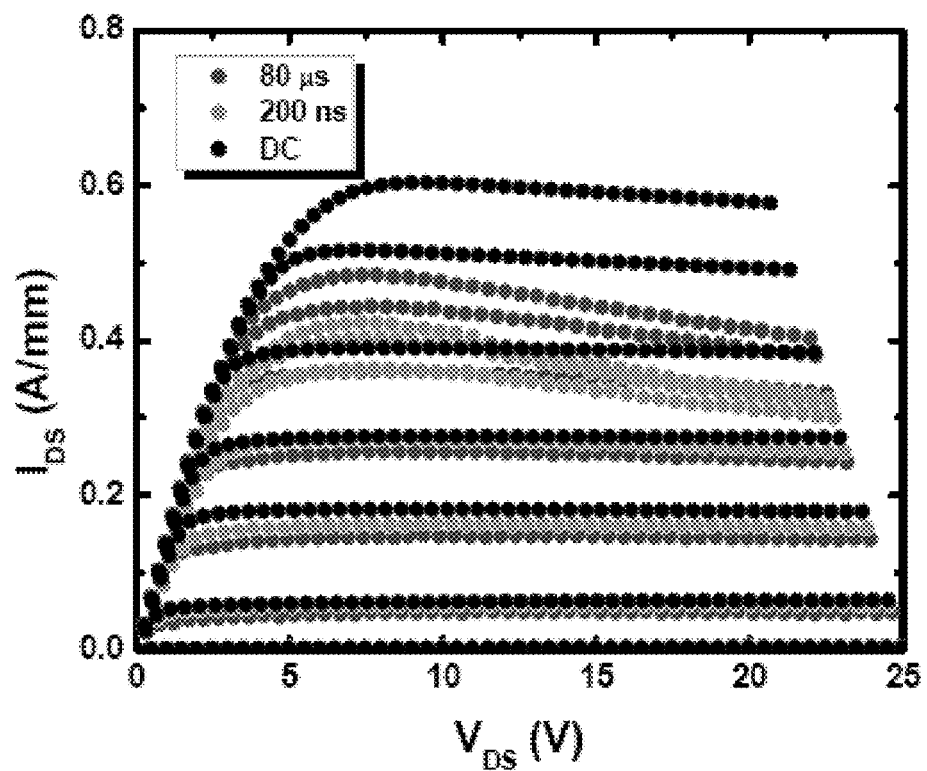
FIG. 6 is a graph plotting $I_{DS}$ as a function of $V_{DS}$, for a DC signal, 80 μs pulsed $V_{GS}$, and 200 ns pulsed $V_{GS}$, wherein $V_{GS}$ is ramped from $V_{GS}$=0 V to $V_{GS}$=3V in 0.5 V steps

FIGS. 3-6 are graphs of the performance of for a device with an epitaxial structure as illustrated in FIG. 1(a), but with a source to gate distance $L_{SG}$=0.5 µm, a gate length $L_G$=0.6 µm and a gate to drain distance $L_{GD}$=2.3 µm. FIG. 3 shows $I_{DS}$~0.55 A/mm at $V_{GS}$=3V, FIG. 4 shows peak $g_m$~250 mS/mm, FIG. 5 shows $f_T$~20 GHz and $f_{MAX}$~38 GHz, and FIG. 6 shows a kink in pulsed IV curve, possibly due to traps at the p-GaN/AlGaN interface.

Figure 7:
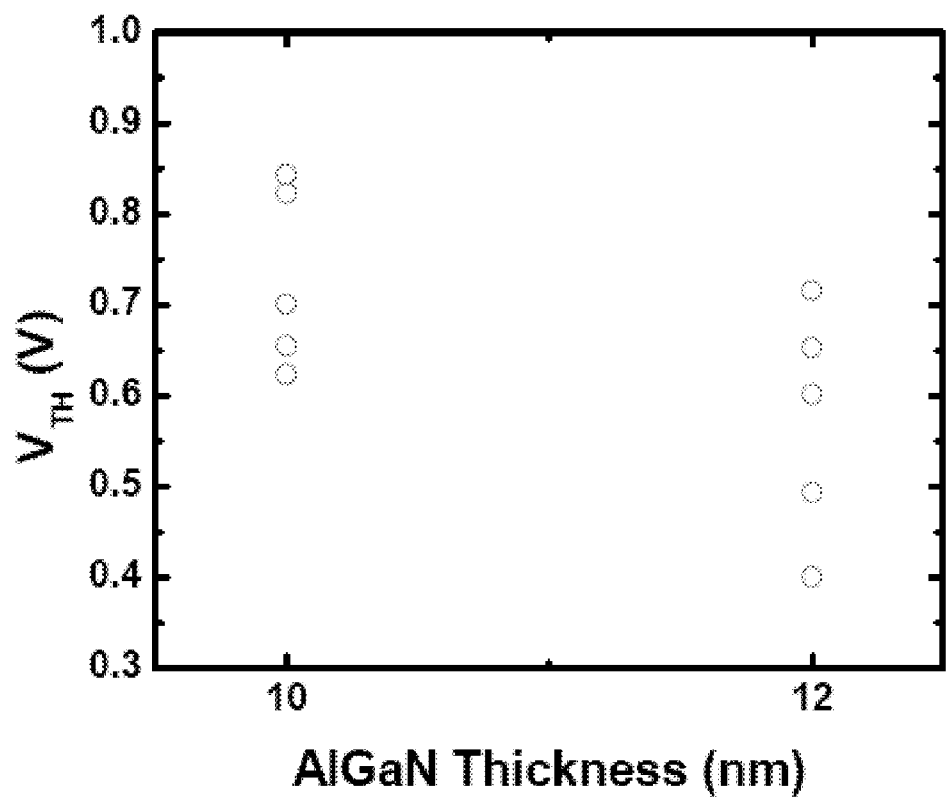
FIG. 7 is a graph plotting measured threshold voltage $V_{TH}$ as a function of AlGaN barrier thickness.

FIG. 7 is measured $V_{TH}$ as a function of thickness of the AlGaN layer 106, for one example of a device structure, grown by MOCVD, where the p-GaN layer 104 is 10 nm thick, the AlGaN layer 106 is 10 nm or 12 nm thick, and the AlN layer 108 is 0.6 nm thick.

Table 1 shows various parameters for the device of FIG. 5 as a function of AlGaN layer 106 thickness.

| AlGaN Thickness (nm) | Resistivity Ω/m | Sheet density $n_s(\times 10^{12}$ cm$^{-1})$ | Mobility (cm$^2$V$^{-1}$s$^{-1}$) |
| --- | --- | --- | --- |
| 10 | 665 | 4.7 | 2133 |
| 12 | 533 | 5.6 | 2160 |

Figure 8:
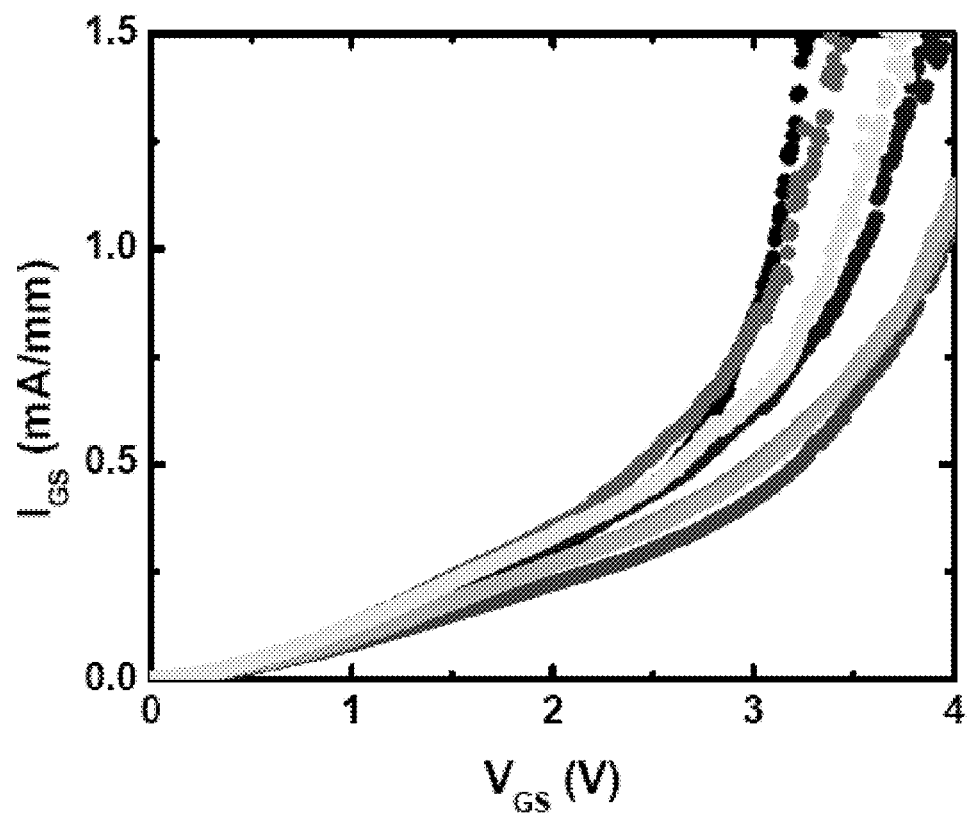
FIG. 8 is a graph plotting measured gate-source current $I_{GS}$ as a function of $V_{GS}$.
Figure 9:
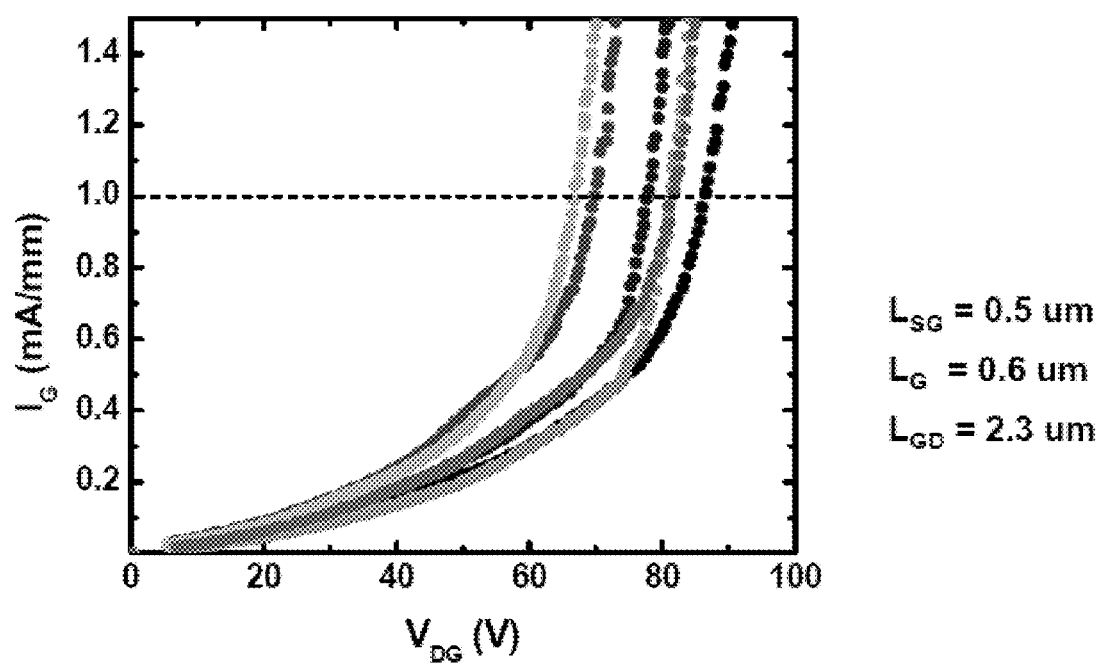
FIG. 9 is a graph plotting measured gate leakage current $I_G$ as a function of gate-drain voltage $V_{DG}$.
Figure 10:
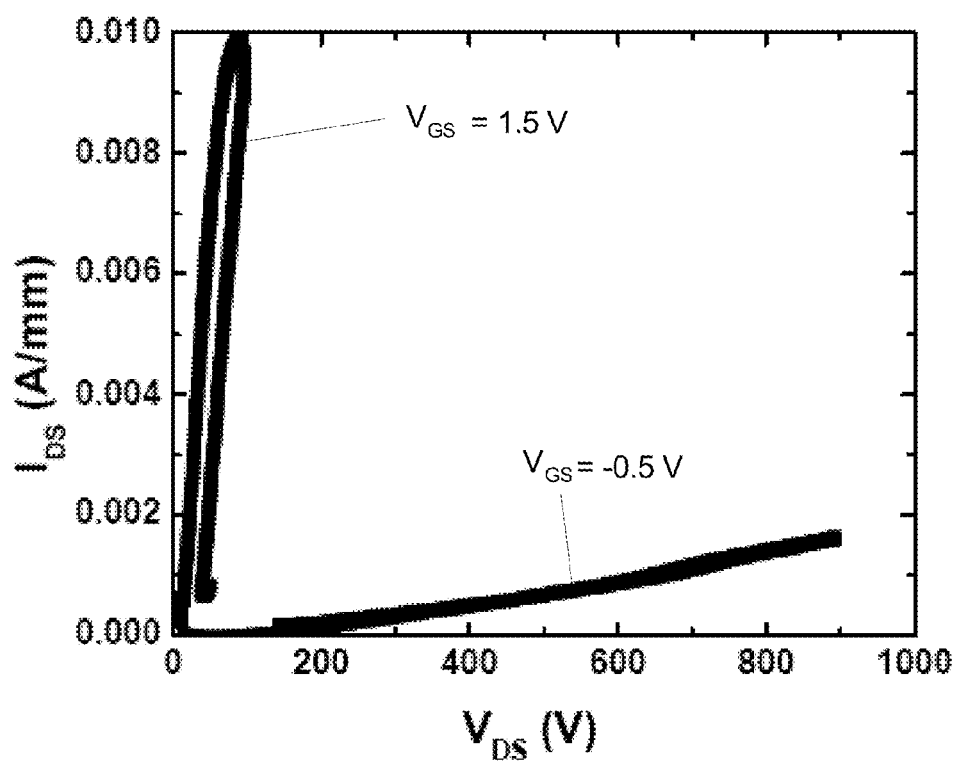
FIG. 10 is a graph plotting measured $I_{DS}$ as a function of $V_{DS}$, for $V_{GS}$=−0.5 V and 1.5V.
Figure 11:
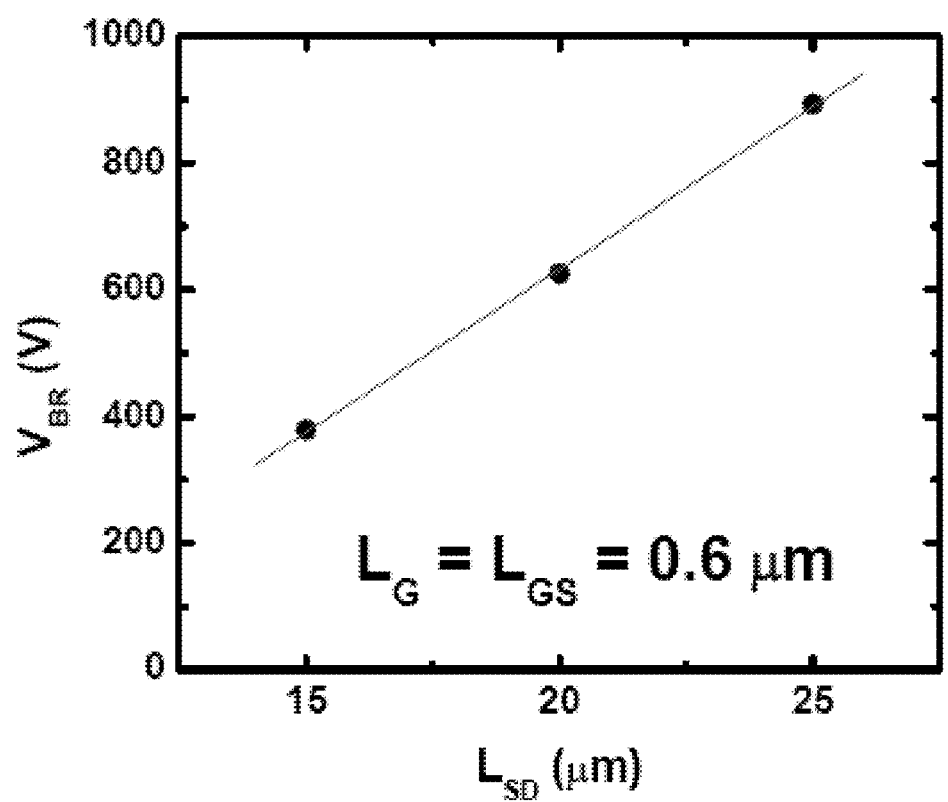
FIG. 11 is a graph plotting measured breakdown voltage $V_{BR}$ of a HEMT as a function of the distance between source and drain $L_{SD}$, for $L_G$=$L_{GS}$=0.6 μm.

FIGS. 8-11 are measurements of various parameters for devices fabricated using the structure of FIG. 1, wherein FIG. 8 shows the gate turn on and that gate forward current is below 1 mA/mm at $V_{GS}$=3 V, FIG. 9 shows gate leakage below 1 mA/m even for $V_{DG}$ in the range 60-80 V (for a device processed with $L_{SG}$=0.6 µm, $L_G$=0.6 µm, and $L_{GD}$=2.3 µm) and FIGS. 10-11 show breakdown voltages ~900 V for $L_{SD}$ without field plates (wherein $L_G$=$L_{SG}$=0.6 µm in FIG. 11).

Figure 12:
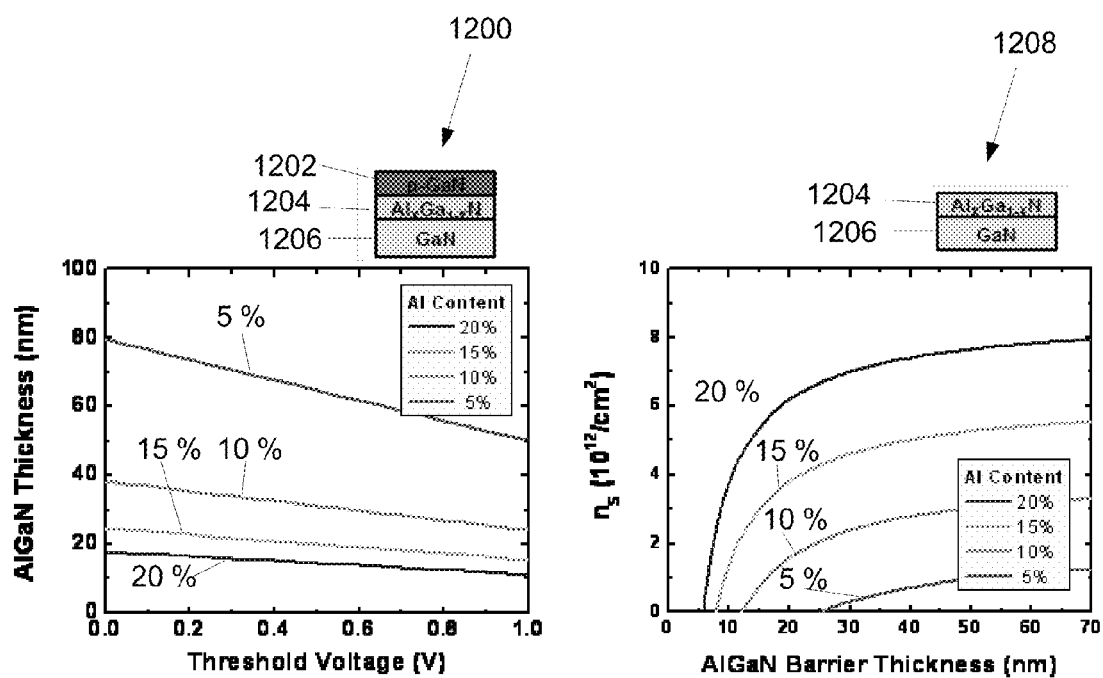
FIG. 12(a) is a graph (calculation) of AlGaN thickness vs. threshold voltage.
FIG. 12(b) is a graph (calculation) of sheet charge vs. AlGaN thickness for a p-GaN/AlGaN/GaN structure, wherein sheet charge density is very low (approximately 4 to 5 e12 cm$^{-2}$) at an AlGaN thickness required for high threshold voltages.

FIG. 12(a) is a graph (calculation) of AlGaN thickness vs. threshold voltage, and FIG. 12(b) is a graph (calculation) of sheet charge vs. AlGaN thickness for a p-GaN/AlGaN/GaN structure, wherein the inset 1200 shows the p-GaN 1202/AlGaN 1204/GaN 1206 layer structure used to measure the data of FIG. 12(a), inset 1208 shows the AlGaN 1204/GaN 1206 layer structure used to measure the data of FIG. 12(b), the data is measured for Al contents of the AlGaN 1204 of 20%, 15%, 10% and 5%, wherein sheet charge density is very low (approximately 4 to 5 e12 cm$^{-2}$) at an AlGaN thickness required for high threshold voltages (e.g., Al content 20% and AlGaN thickness of 10 nm).

While enhancement mode devices without the AlN 108 layer are possible, such devices with high threshold voltage will suffer from high on-resistance due to the large AlGaN 106 thickness required, as shown in FIGS. 12(a) and 12(b). However, with an AlN 108 layer, devices 100 with high threshold voltage and low access resistance can be obtained due to the high polarization field in the AlN 108 layer, as shown in FIG. 2(a).

EMBODIMENT WITHOUT AN AlN LAYER

Figure 13:
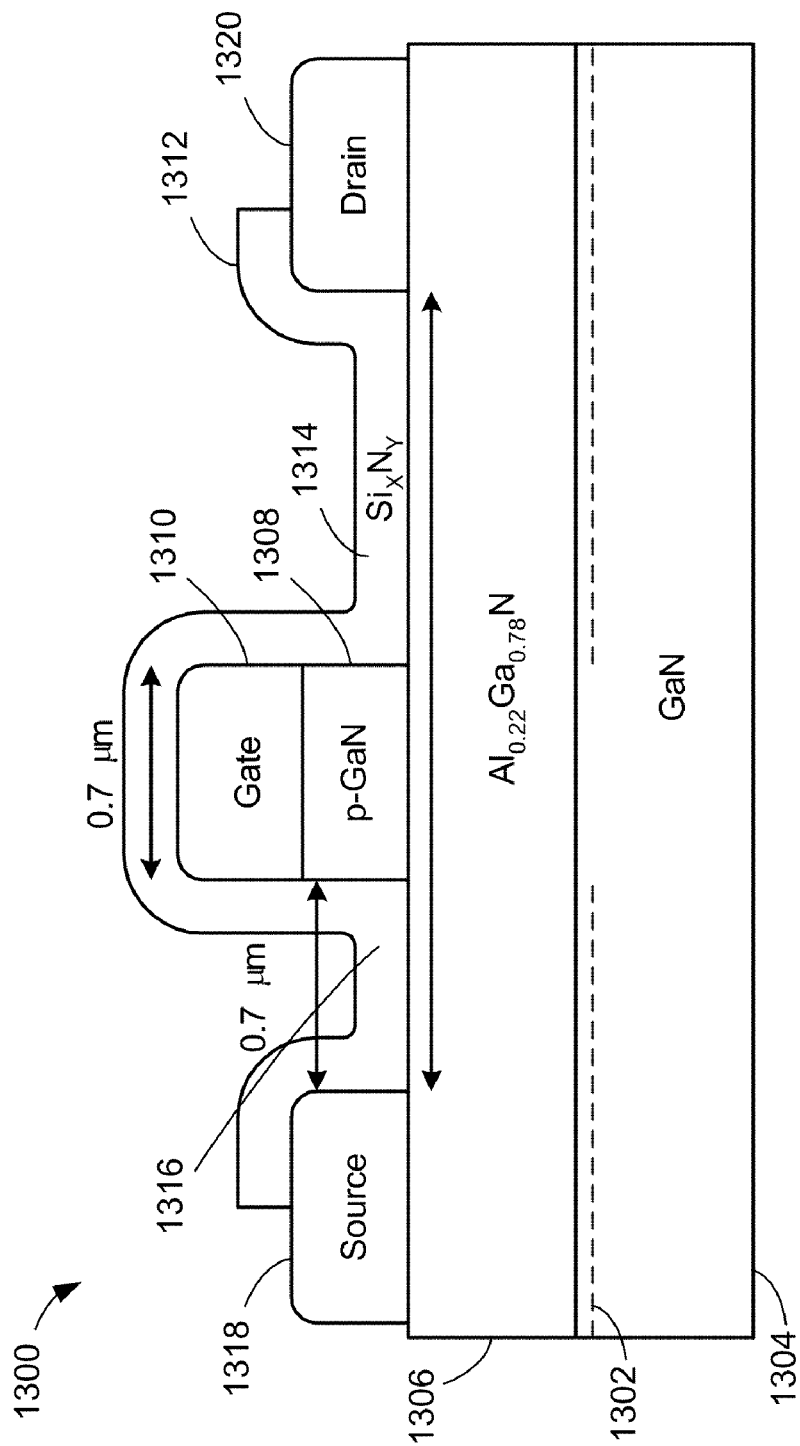
FIG. 13 shows a schematic of an enhancement mode device.
Figure 14:
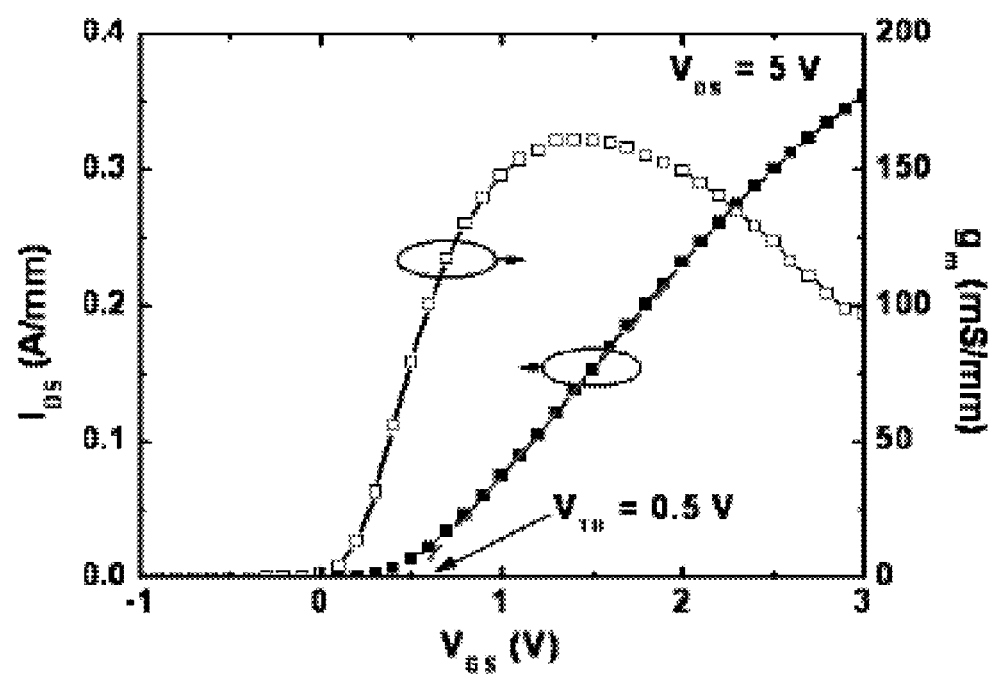
FIG. 14 is a graph plotting measured $I_{DS}$ as a function of $V_{GS}$, and $g_m$ as a function of $V_{DS}$, for $V_{DS}$=5 V and showing $V_{TH}$=0.5 V.
Figure 15:
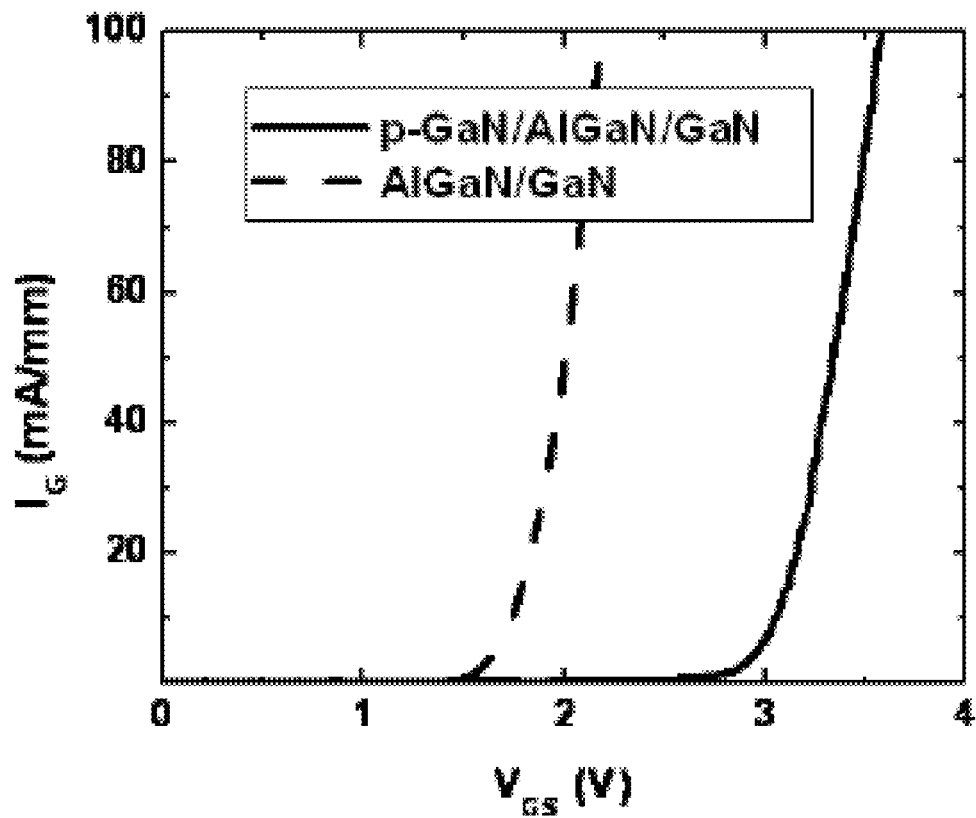
FIG. 15 is a graph plotting measured $I_G$ (gate leakage) as a function of $V_{GS}$.

FIG. 13 shows a HEMT or FET device 1300 fabricated on material grown by RF plasma-assisted molecular beam epitaxy, comprising a 2DEG 1302 confined in a GaN layer 1304 by an AlGaN layer 1306, and a p-GaN layer 1308 between the AlGaN layer 1306 and the gate 1310. $Si_xN_y$ 1312 is deposited in the access regions 1314, 1316 between the gate 1310 and the source 1318 and between the gate 1310 and the drain 1320 (and partially on the source 1318 and drain 1320). For the device 1300, $L_{SG}$=0.7 µm, $L_G$=0.7 µm, and $L_{GD}$=2.0 µm. The Mg doping concentration in the 10 nm-thick p-GaN layer 1308 is approximately $1 \times 10^{18}$ and the thickness of the $Al_{0.22}Ga_{0.78}N$ layer 1306 is 12 nm. The p-GaN 1308 in the source 1318 and drain regions 1320 was etched away prior to ohmic metal deposition using a self-aligned dry etch while the p-GaN in the access regions 1314, 1316 was etched away using the ohmic contacts and the gate electrode as masks. Peak $g_m$ of 160 mS/mm is reached at $V_{GS}$ of 1.4 V, the threshold voltage is ~0.5 V, and maximum $I_{DS}$~300 mA/mm at $V_{GS}$=3V, as shown in FIG. 14. The 3 V turn-on of the gate diode is approximately 1 V higher than standard Schottky gates as shown in FIG. 15.

Figure 16:
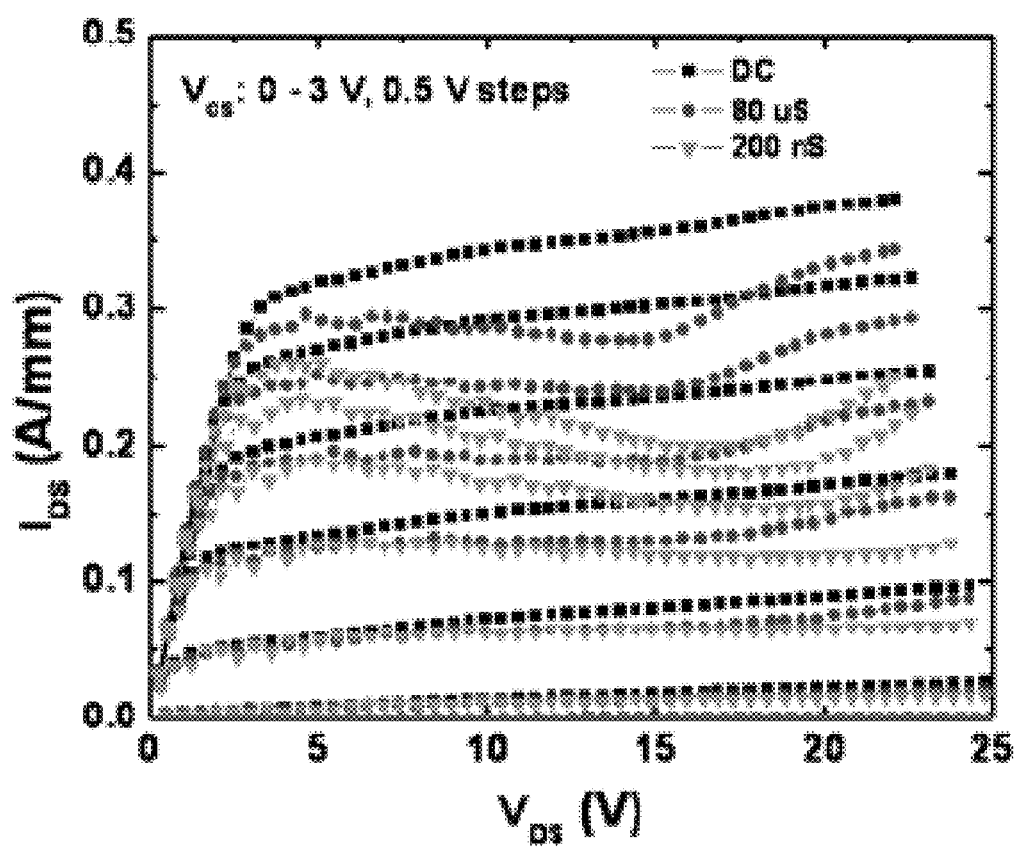
FIG. 16 is a graph plotting $I_{DS}$ as a function of $V_{DS}$, for a DC signal, 80 μs pulsed $V_{GS}$, and 200 ns pulsed $V_{GS}$, wherein $V_{GS}$ is ramped from $V_{GS}$=0 V to $V_{GS}$=3V in 0.5 V steps.
Figure 17:
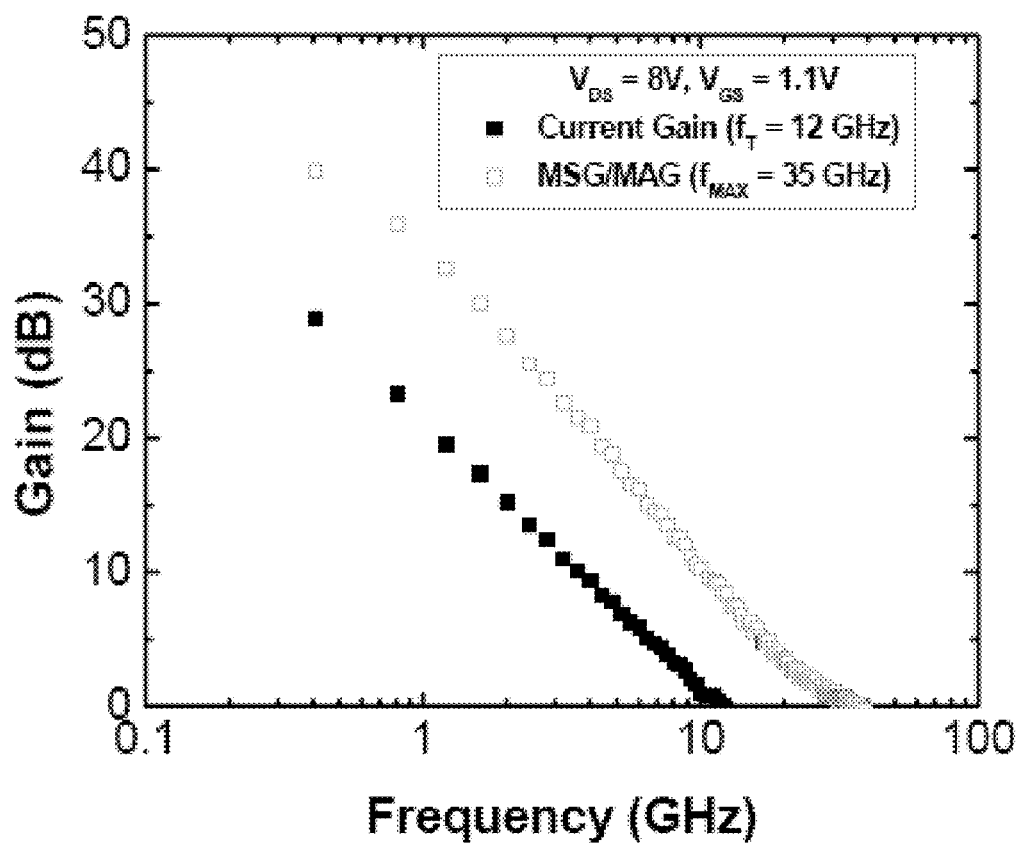
FIG. 17 is a graph plotting measured gain as a function of frequency of $V_{GS}$.

The DC, 80 µs, and 200 ns-pulsed I-V output characteristics of the device 1300 are shown in FIG. 16. The maximum output current of the device is the highest reported among p-GaN gated E-mode HEMTs. The kink in the pulsed I-V (FIG. 16, which may be caused by traps in the p-GaN/AlGaN interface, is currently under investigation. Consequently, the device exhibits $f_T$ of 12 GHz and $f_{max}$ of 35 GHz which are lower than that of depletion-mode (D-mode) devices with similar dimensions (FIG. 17). Similar behavior has been observed and solved in other GaN-based HEMTs that have GaN/AlGaN interfaces with net a negative polarization charge [5]. Application of similar solutions is currently being evaluated as well.

In order to realize a p-GaN gated device with a threshold voltage of 1 V and high current density, calculations indicate the need for an AlN interlayer due to trade-off between threshold voltage and access resistance as shown in FIG. 12(a), FIG. 12(b), FIG. 2(a) and FIG. 2(b). Without an AlN interlayer, threshold voltage of 1 V can be achieved, but the device will exhibit extremely low current due to high access resistance (FIG. 12(a) and FIG. 12(b)). With an AlN interlayer, threshold voltage of 1 V can be achieved with much lower access resistance (FIG. 2(a) and FIG. 2(b)). Compare, for example, the maximum 2DEG density of $4 \times 10^{12}$ cm$^{-2}$ in FIG. 12(b) with the maximum 2DEG density of $7 \times 10^{12}$ cm$^{-2}$ in FIG. 2(b). Thus, the present invention may develop a p-GaN/AlGaN/AlN/GaN E-mode HEMTs with a threshold voltage of at least 1 V and high current density, for example, a gate turn on voltage of at least 3 V, and a maximum output current in excess of 0.3 A/mm.

Process Steps

Figure 18:
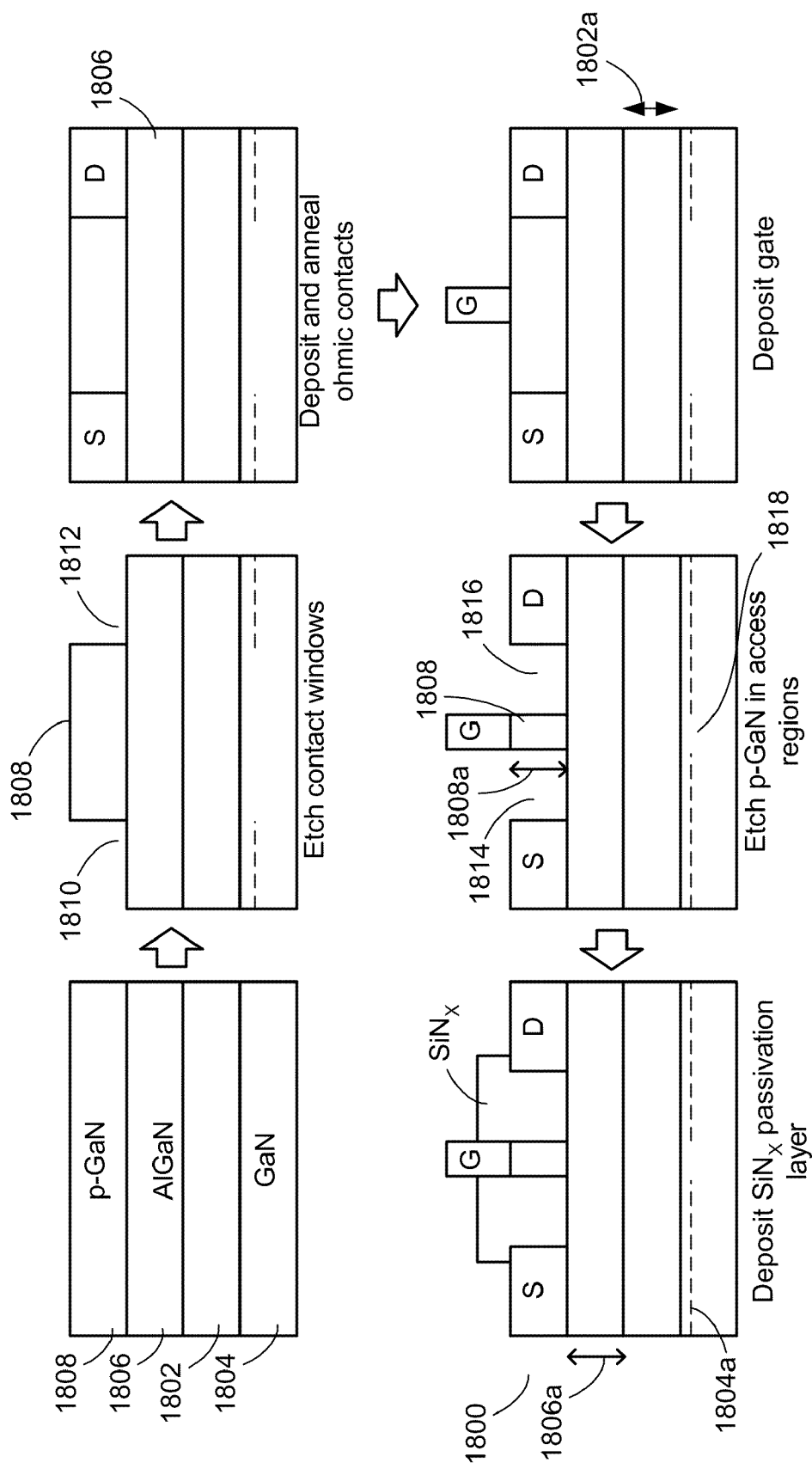
FIG. 18 is a flowchart illustrating a method of the present invention.

FIG. 18 is a flowchart illustrating a method for fabricating an E-mode field effect transistor 1800, such as a HEMT. The method comprises one or more of the following steps:

FIG. 18(a) illustrates the step of depositing an AlN interlayer 1802 on a GaN layer 1804 (wherein the GaN 1804 is for containing a 2DEG 1804a), an AlGaN layer 1806 on the AlN layer 1802, and a p-GaN layer 1808 on the AlGaN layer 1806. A thickness 1806a and material composition (e.g., Al content) of the III-nitride barrier layer 1806 may be selected to obtain a desired threshold voltage $V_{TH}$ of the HEMT, wherein the thickness 1806a does not substantially reduce an on-resistance of the HEMT or resistance of the 2DEG 1804a. The thickness 1806a of the III-nitride barrier 1806 may be selected to obtain the threshold voltage of at least 1V and a charge density of the 2DEG 1804a in excess of $7 \times 10^{12}$ cm$^{-2}$ or a current density in the 2DEG 1804a is in excess of 0.3 A/mm. A thickness 1808a of the p-type III-nitride layer 1808 may be selected to obtain a turn-on voltage of the gate G of 3 V or greater.

FIG. 18(b) illustrates the step of etching contact windows 1810, 1812 in the p-GaN 1808.

FIG. 18(c) illustrates the step of depositing source S and drain D contacts in the windows 1810, 1812 respectively, on the AlGaN 1806 and annealing the contacts S and D to form ohmic contacts S and D.

FIG. 18(d) illustrates the step of depositing a gate G on the p-GaN layer 1808.

FIG. 18(e) illustrates the step of etching the p-GaN 1808 in the access regions 1814, 1816 to achieve a device 1800. FIG. 18(e) illustrates a nitride based E-mode HEMT or Field Effect Transistor (FET) 1800, comprising a III-nitride channel layer 1804 having a channel potential energy for containing a 2DEG 1804a; a III-nitride barrier layer 1806 positioned for, and having a barrier potential energy for, confining the 2DEG 1804a in the channel layer 1804, wherein a polarization coefficient of the barrier layer 1806 is larger than the polarization coefficient of the channel layer 1804; a III-nitride interlayer 1802 between the barrier layer 1806 and the channel layer 1804, wherein the III-nitride interlayer 1802 has a thickness 1802a and a polarization coefficient greater higher than a polarization coefficient of the channel layer 1804; a source S for supplying a current to the 2DEG 1804a; a drain D for supplying an output current, wherein the current flows from the source S, through the 2DEG 1804a and then to the drain D to produce the output current; a gate G for controlling the current's flow through the 2DEG 1804a; and a p-type III-nitride layer 1808 between the barrier layer 1806 and the gate G having a thickness 1808a to raise a potential energy in a region between the channel 1804 and the gate G for depleting 1818 the 2DEG 1804a under the gate G at zero bias.

The HEMT may further comprise a first access region 1814 between the source S and the gate G and a second access region 1816 between the drain D and the gate G, wherein the p-type nitride layer 1808 is not present under the source S, drain D, first access region 1814 and second access region 1816. The thickness 1806a of the III-nitride barrier layer 1806 may be smaller than a thickness 1806a of the III-nitride barrier layer 1806 in a HEMT without the III-nitride interlayer 1808.

The barrier layer 1806 may AlGaN and the interlayer 1802 may be AlN. The thickness 1802a of the AlN layer 1802 may be thin enough such that the AlN is not relaxed but is strained, due to a lattice mismatch with the barrier layer 1806 and the channel layer 1804, for example, the thickness 1802a may be less than 20 nm. The AlN interlayer 1802 may interface the barrier layer 1806 and the channel layer 1804.

FIG. 18(f) illustrates the step of depositing a SiN$_x$ passivation layer in the access regions 1814, 1816 and partially on the contacts S and D.

Figure 19:
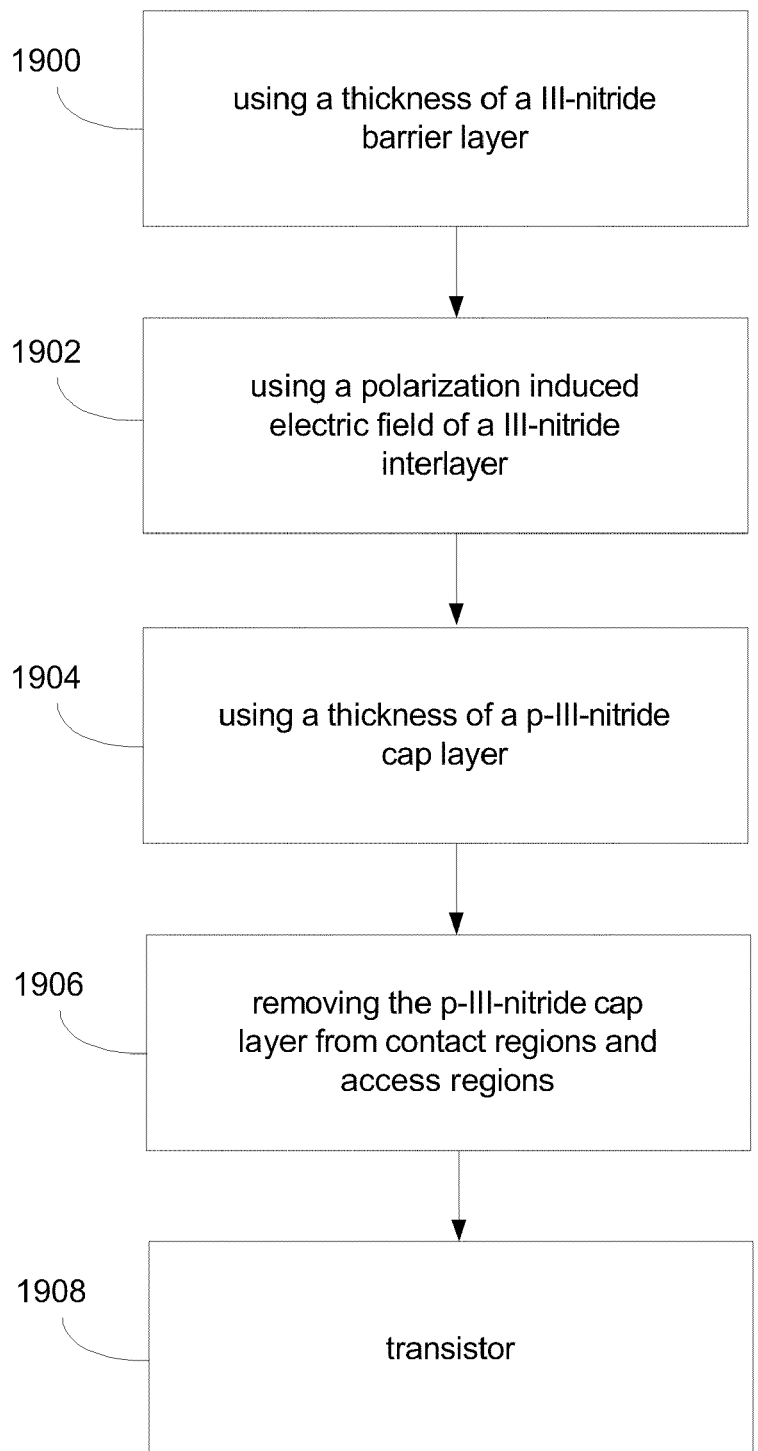
FIG. 19 is a flowchart illustrating a method of the present invention.

FIG. 19 is a flowchart illustrates a method for fabricating a field effect transistor, comprising one or more of the following steps:

Block 1900 represents the step of using a thickness of a III-nitride barrier layer to control a threshold voltage of the transistor's gate and confine a 2DEG in a channel layer of the transistor. The step may comprise selecting a thickness and material composition of the III-nitride barrier layer to obtain a desired threshold voltage of the transistor, wherein the thickness of the III-nitride barrier layer does not substantially decrease the on-resistance of the transistor, or substantially decrease the 2DEG resistance. The III-nitride barrier layer may be AlGaN, and the material composition may be Al content, and the transistor may be an E-mode HEMT. The thickness and material composition may be selected to obtain the threshold voltage of 1 V or greater, or maximize the threshold voltage. The obtained threshold voltage may be at least 1V and the on-resistance may correspond to a charge density in the 2DEG in excess of $7 \times 10^{12}$ cm$^{-2}$ or allow a current density in the 2DEG in excess of 0.3 A/mm.

Block 1902 represents the step of using a polarization induced electric field of a III-nitride interlayer between the 2DEG and the III-nitride barrier layer to induce a larger 2DEG charge density as compared to without the III-nitride interlayer, thereby reducing an on-resistance of the transistor and controlling the on-resistance independently of the threshold voltage. The thickness and composition of the III-nitride barrier layer may be selected to maximize the threshold voltage independently (or without affecting) the resistance or charge density of the 2DEG, or the on-resistance of the transistor. The magnitude of the polarization induced electric field is proportional to the thickness of the III-nitride barrier layer, i.e. the polarization induced electric field increases as the thickness of the AlN layer increases.

Block 1904 represents the step of using a thickness of p-III-nitride cap layer between the gate and the III-nitride barrier layer to increase a gate turn-on of the transistor's gate, wherein the p-III-nitride layer depletes the 2DEG under the gate at zero gate bias. The gate turn-on may be at least 3 V.

Block 1906 represents the step of removing the p-III-nitride cap layer from contact regions and access regions of the transistor, wherein the thickness of the III-nitride barrier layer is smaller than a thickness of the III-nitride barrier layer in a transistor without the III-nitride barrier layer.

Block 1908 represents the step of obtaining a transistor, for example, an enhancement mode HEMT, wherein the III-nitride barrier layer is AlGaN and the p-III-nitride layer is p-GaN.

Possible Modifications and Variations

Insertion of an insulator (any combination of $Si_xO_y$, $Si_xN_y$, $Al_xO_y$, and/or any other insulator, thickness ranging from 0.1 Å to 5000 Å) beneath the gate electrode 102 (and above the p-type layer 104) can further reduce gate leakage and increase the gate turn-on.

Moreover, the p-GaN 104 and/or GaN-buffer 110 layer can be substituted by p-AlGaInN, and AlGaInN, respectively.

Also, the p-GaN 104, AlGaN 106, and AlN 108 layers do not have to be abrupt, as they can be gradually graded (in terms of Al composition).

The on-resistance (or access resistance) can be further reduced by increasing the thickness of AlGaN 106 in the access regions 118 (by regrowth of AlGaN in the access region 118 or by selectively regrowing the p-GaN 104 below the gate after etching away some of the AlGaN below the gate). The on-resistance can also be reduced by ion-implanting the access regions with donor species. These two methods can be used together or separately.

Throughout this disclosure, (Al,Ga,In)N, AlGaInN, and III-nitride refer to III-nitride compounds. On resistance refers to the resistance of the entire device, and access resistance refers to the resistance of the access regions only. The access region is between the contacts and the gate region. It extends on each side of the gate to the contacts.

REFERENCES

The following references are incorporated by reference herein:

[1] W. B. Lanford et al. Electronics Letters, Vol. 41, p. 449 (2005).

[2] Y. Cai et al., IEEE Electron Device Letters, Vol. 26, p. 435 (2005).

[3] X. Hu et al., "Enhancement Mode AlGaN/GaN HFET with selectively grown pn junction gate," Electronics Letters, Vol. 36, p. 753 (2000).

[4] N. Tsuyukuchi et al., "Low leakage current Enhancement Mode AlGaN/GaN Heterostructure Field Effect Transistor using p-type gate contact," Japanese Journal of Applied Physics 45(11), L319-L321 (2006).

[5] S. Rajan et al., 32nd ISCS (2005).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A nitride based enhancement mode High Electron Mobility Transistor (HEMT), comprising:
   (a) a III-nitride channel layer having a channel potential energy for containing a two dimensional electron gas (2DEG), wherein the 2DEG has a resistance;
   (b) a III-nitride barrier layer positioned for, and having a barrier potential energy for, confining the 2DEG in the channel layer, wherein a polarization coefficient of the barrier layer is larger than a polarization coefficient of the channel layer;
   (c) a III-nitride interlayer between the barrier layer and the channel layer, wherein the III-nitride interlayer has a polarization coefficient higher than the polarization coefficient of the barrier layer;
   (d) a source for supplying a current to the 2DEG;
   (e) a drain for supplying an output current, wherein the current flows from the source, through the 2DEG and then to the drain to produce the output current;
   (f) a gate for controlling the current's flow through the 2DEG; and
   (g) a p-type III-nitride layer between the III-nitride barrier layer and the gate for depleting the 2DEG under the gate at zero bias.

2. The HEMT of claim 1, further comprising a thickness and material composition of the III-nitride barrier layer, wherein the thickness and the material composition is selected to obtain a desired threshold voltage of the HEMT.

3. The HEMT of claim 2, further comprising a thickness of the p-type III-nitride layer, wherein the thickness of the p-type III-nitride layer is selected to obtain a turn-on voltage of the gate of 3 V or greater.

4. The HEMT of claim 2, wherein the thickness of the III-nitride barrier layer does not substantially reduce an on-resistance of the HEMT or resistance of the 2DEG.

5. The HEMT of claim 2, wherein the thickness and the material composition of the III-nitride barrier is selected to obtain the threshold voltage of at least 1V and a charge density of the 2DEG in excess of $7\times10^{12}$ cm$^{-2}$ or a current density in the 2DEG is in excess of 0.3 A/mm.

6. The HEMT of claim 2, further comprising:
   (a) a first access region between the source and the gate and a second access region between the drain and the gate, wherein the p-type III-nitride layer is not present under the source, drain, first access region and second access region; and
   (b) the thickness of the III-nitride barrier layer which is smaller than a thickness of the III-nitride barrier layer in a HEMT without the III-nitride interlayer.

7. The HEMT of claim 2, wherein the III-nitride barrier layer is AlGaN, the material composition is an Al content, and the III-nitride interlayer is AlN.

8. The HEMT of claim 7, wherein a thickness of the AlN is thin enough such that the AlN is not relaxed but is strained, due to a lattice mismatch with the barrier layer and the channel layer, or is less than 20 nm.

9. The HEMT of claim 2, wherein the III-nitride interlayer interfaces the III-nitride barrier layer and the III-nitride channel layer.

10. The HEMT of claim 2, wherein the channel layer is GaN and the p-type III-nitride layer is GaN.

* * * * *